(12) United States Patent
Egusa et al.

(10) Patent No.: US 9,887,142 B2
(45) Date of Patent: Feb. 6, 2018

(54) POWER SEMICONDUCTOR DEVICE

(71) Applicant: Mitsubishi Electric Corporation, Chiyoda-ku, Tokyo (JP)

(72) Inventors: Minoru Egusa, Tokyo (JP); Kazuyoshi Shige, Fukuoka (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/463,134

(22) Filed: Mar. 20, 2017

(65) Prior Publication Data
US 2017/0194223 A1    Jul. 6, 2017

Related U.S. Application Data

(63) Continuation of application No. 14/655,962, filed as application No. PCT/JP2014/053287 on Feb. 13, 2014, now Pat. No. 9,640,453.

(30) Foreign Application Priority Data

Feb. 26, 2013  (JP) ................................. 2013-035291

(51) Int. Cl.
H01L 23/24    (2006.01)
H01L 23/053   (2006.01)
(Continued)

(52) U.S. Cl.
CPC ............ *H01L 23/053* (2013.01); *H01L 23/24* (2013.01); *H01L 24/45* (2013.01); *H01L 24/49* (2013.01);
(Continued)

(58) Field of Classification Search
CPC ........ H01L 23/053; H01L 23/24; H01L 23/49
See application file for complete search history.

(56) References Cited

U.S. PATENT DOCUMENTS 6,129,584 A    10/2000 Chiba et al.
7,494,389 B1    2/2009 Essert et al.
(Continued)

FOREIGN PATENT DOCUMENTS

EP    2557633 A1    2/2013
EP    2642517 A1    9/2013
(Continued)

OTHER PUBLICATIONS

Extended European Search Report dated Oct. 7, 2016 issued in corresponding European Patent Appln. No. 14757420.6 (8 pages).
(Continued)

*Primary Examiner* — Tran Tran
(74) *Attorney, Agent, or Firm* — Buchanan Ingersoll & Rooney PC

(57) ABSTRACT

This invention is provided with: a circuit board which is placed in a package and in which an electric circuit including a power semiconductor element is formed; and a plurality of press-fit terminals each having a wire-bond portion electrically connected in the package to the electric circuit, a press-fit portion for making electrical connection with an apparatus to be connected, and a body portion whose one end portion continuous to the wire bond portion is internally fastened to the package and whose other end portion supports the press-fit portion so as to place the press-fit portion away from the package; wherein in each of the plurality of press-fit terminals, at a portion in the body portion exposed from the package, there is formed a constriction portion that is constricted from both sides in a direction perpendicular to the center line, so as to leave a portion around the center line.

13 Claims, 16 Drawing Sheets

(51) Int. Cl.
  *H01L 25/07* (2006.01)
  *H01L 25/18* (2006.01)
  *H01R 12/58* (2011.01)
  *H01R 13/405* (2006.01)
  *H01R 4/48* (2006.01)
  *H01R 13/05* (2006.01)
  *H01L 23/00* (2006.01)

(52) U.S. Cl.
  CPC ............ *H01L 25/072* (2013.01); *H01L 25/18* (2013.01); *H01R 4/48* (2013.01); *H01R 12/585* (2013.01); *H01R 13/05* (2013.01); *H01R 13/405* (2013.01); *H01L 23/562* (2013.01); *H01L 2224/45124* (2013.01); *H01L 2224/48091* (2013.01); *H01L 2224/48101* (2013.01); *H01L 2224/48106* (2013.01); *H01L 2224/48137* (2013.01); *H01L 2224/48227* (2013.01); *H01L 2224/48229* (2013.01); *H01L 2924/00014* (2013.01); *H01L 2924/1033* (2013.01); *H01L 2924/10254* (2013.01); *H01L 2924/10272* (2013.01); *H01L 2924/1203* (2013.01); *H01L 2924/1305* (2013.01); *H01L 2924/13055* (2013.01); *H01L 2924/181* (2013.01); *H01L 2924/19107* (2013.01)

(56) References Cited

U.S. PATENT DOCUMENTS

| | | | |
|---|---|---|---|
| 2008/0150102 A1 | 6/2008 | Yokomae et al. | |
| 2009/0194884 A1 | 8/2009 | Stolze | |
| 2012/0115339 A1 | 5/2012 | Schaarschmidt et al. | |
| 2012/0187554 A1 | 7/2012 | Oka et al. | |
| 2012/0190242 A1 | 7/2012 | Kataoka et al. | |
| 2013/0250535 A1 | 9/2013 | Takamiya et al. | |
| 2014/0167241 A1* | 6/2014 | Matsuoka ............ | H01L 23/24 257/690 |
| 2016/0233146 A1 | 8/2016 | Nakamura | |

FOREIGN PATENT DOCUMENTS

| | | |
|---|---|---|
| JP | H11074046 A | 3/1999 |
| JP | 11-097598 A | 4/1999 |
| JP | 2001-085571 A | 3/2001 |
| JP | 2004-022705 A | 1/2004 |
| JP | 2008-098585 A | 4/2008 |
| JP | 2010-010502 A | 1/2010 |
| JP | 2010-212538 A | 9/2010 |
| JP | 2011-090797 A | 5/2011 |
| JP | 2011096695 A | 5/2011 |
| JP | 2011-165836 A | 8/2011 |
| JP | 2012-151019 A | 8/2012 |
| JP | 2012-151063 A | 8/2012 |
| JP | 2012-529731 A | 11/2012 |
| JP | 2013-004239 A | 1/2013 |
| WO | 2011/125747 A1 | 10/2011 |
| WO | 2012/066833 A1 | 5/2012 |

OTHER PUBLICATIONS

International Search Report (PCT/ISA/210) dated May 20, 2014, by the Japanese Patent Office as the International Searching Authority, issued in corresponding International Appln. No. PCT/JP2014/053287, with English translation (3 pages).

Japanese Office Action dated Jun. 28, 2016 issued in corresponding Japanese Patent Appln. No. 2015-502853, with English translation (7 pages).

Japanese Office Action dated Dec. 20, 2016 issued in corresponding Japanese Patent Appln. No. 2015-502853, with English translation (9 pages).

Korean Office Action dated Sep. 23, 2016 issued in corresponding Korean Patent Appln. No. 10-2015-7023029, with English translation (7 pages).

Office Action dated Apr. 1, 2017, by the Chinese Patent Office in corresponding Chinese Patent Application No. 201480009806.5 and English translation of the Office Action. (13 pages).

Japanese Office Action dated Nov. 21, 2017 in Patent Application No. 2017-076447, and English translation.

* cited by examiner

POWER SEMICONDUCTOR DEVICE

TECHNICAL FIELD

The present invention relates to a power semiconductor device and, in particular, to a structure of a terminal for connecting the same to another apparatus.

BACKGROUND ART

Among semiconductor devices, power semiconductor devices are used for controlling and/or rectifying relatively large power, in railroad vehicles, hybrid cars, electric cars or like vehicles, electric home appliances, industrial machines, and the like. Accordingly, semiconductor elements used for the power semiconductor devices are required to flow a current with a high current density of exceeding 100 A/cm$^2$. Thus, in recent years, silicon carbide (SiC) that is a wide bandgap semiconductor material has drawn attention as a semiconductor material substitute for silicon (Si). The semiconductor element made of SiC is operable at a current density higher than that of silicon.

Meanwhile, in each of semiconductor devices, a plurality of terminals are disposed so as to project from the housing (see, for example, Patent Document 1). Since in an apparatus that uses a certain semiconductor device, connection portions corresponding to the terminals of that semiconductor device are disposed in conformity with the arrangement of the terminals, the semiconductor device can be easily mounted to the apparatus.

CITATION LIST

Patent Document

Patent Document 1: U.S. Patent Application Publication No. US 2009/0194884A1 (Paragraphs 0041 to 0046, FIG. 13)
Patent Document 2: Japanese Patent Application Laid-open No. 2013-4239 (Paragraphs 0032 to 0042, FIG. 3 to FIG. 4)

SUMMARY OF THE INVENTION

Problems to be Solved by the Invention

However, in the power semiconductor devices to be operated at a high current density, it is necessary to make large the cross-section area of the terminal, which results in its rigidity higher than that of the terminal in general semiconductor devices. Therefore, if a placement error or an inclination occurs in the terminal or the connection portion, it is unable to smoothly make connection of them. Thus, there is such a possibility that a failure occurs in electrical connection or a defect occurs in the connected apparatus or the power semiconductor device, so that the tolerance in assembly is low. Further, if there is a difference in linear expansion coefficient between the power semiconductor device and the connected apparatus, because of a temperature change during their use or at the time of starting/stopping operation thereof, there is also a possibility that a stress is repeatedly produced in the terminal or on the contact, so that the contact resistance at the contact increases to thereby reduce the reliability.

Meanwhile, there is disclosed (see, for example, Patent Document 2) a press-fit terminal in which a bent portion forming a bent shape is formed at its leg portion in order to follow the aforementioned placement error. According to such a structure, however, at the time of insertion of the press fit, the bent portion firstly causes a buckling deformation before a resilient portion (press-fit portion) does. Thus, at the time of insertion of the press fit, it is necessary to hold its face to be pressed that is provided at a portion nearer to the resilient portion than to the bent portion, and thus there is a problem that it is difficult to insert the press-fit terminal into a through-hole.

This invention has been made to solve the problems as described above, and an object thereof is to provide a power semiconductor device that can be easily mounted to an apparatus to be connected, and is highly reliable.

Means for Solving the Problems

A power semiconductor device of this invention is characterized by comprising: a housing; a circuit board which is placed in the housing and in which an electric circuit including a power semiconductor element is formed; a plurality of terminals each having an inner terminal portion electrically connected in the housing to the electric circuit, an outer terminal portion for making electrical connection with an apparatus to be connected, and a body portion whose one end continuous to the inner terminal portion is fastened internally to the housing and which supports the outer terminal portion at the other end so as to place the outer terminal portion away from the housing; wherein, in each of the plurality of terminals, at a portion in the body portion exposed from the housing, there is formed a constriction portion that is constricted from both sides in a direction perpendicular to a center line that connects the outer terminal portion and a root portion in the portion exposed from the housing, so as to leave a portion around the center line.

Effect of the Invention

According to the power semiconductor device of the invention, even when a displacement or positional deviation occurs, the constriction portion with a lower rigidity can deform preferentially to the outer terminal portion to thereby reduce the stress. Thus, it is possible to provide a power semiconductor device that can be easily mounted to an apparatus to be connected, and is highly reliable.

MODES FOR CARRYING OUT THE INVENTION

Embodiment 1

Figure 1A:
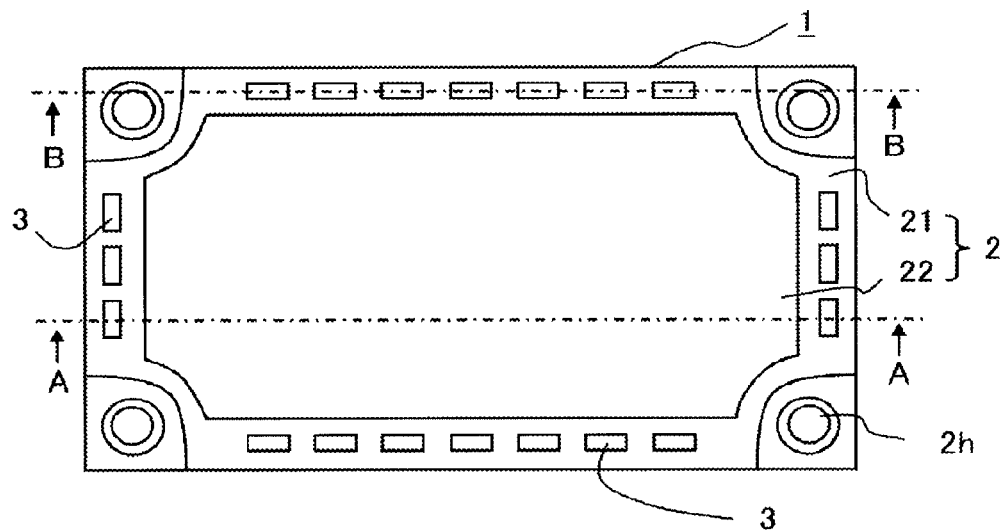
FIGS. 1A and 1B are a plan view and a front view for illustrating a configuration of a power semiconductor device according to Embodiment 1 of the invention.
Figure 1B:
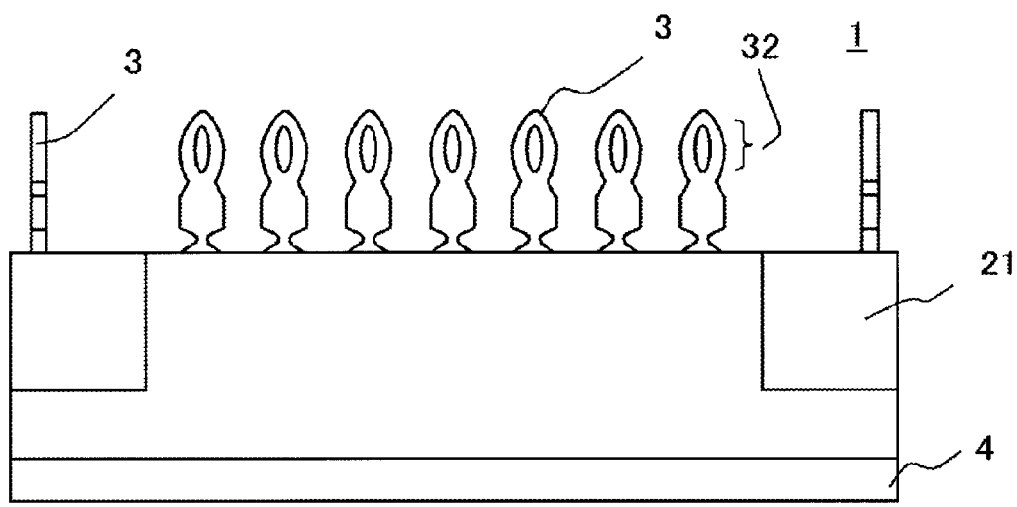
Figure 2:
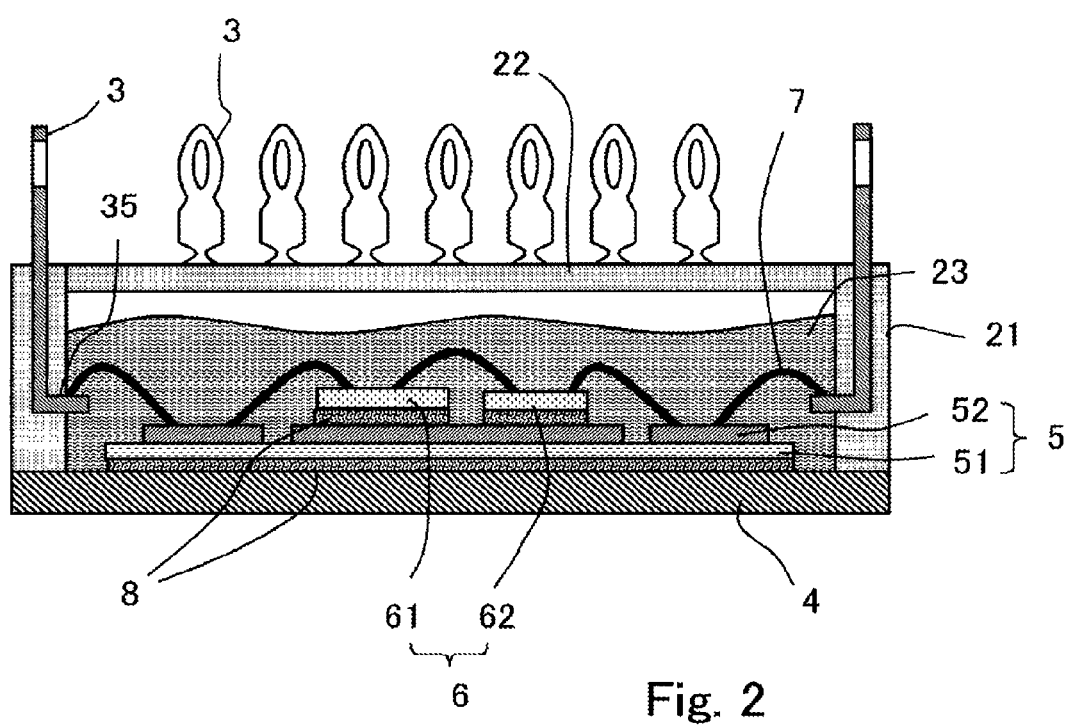
FIG. 2 is a sectional view for illustrating the configuration of the power semiconductor device according to Embodiment 1 of the invention.
Figure 3:
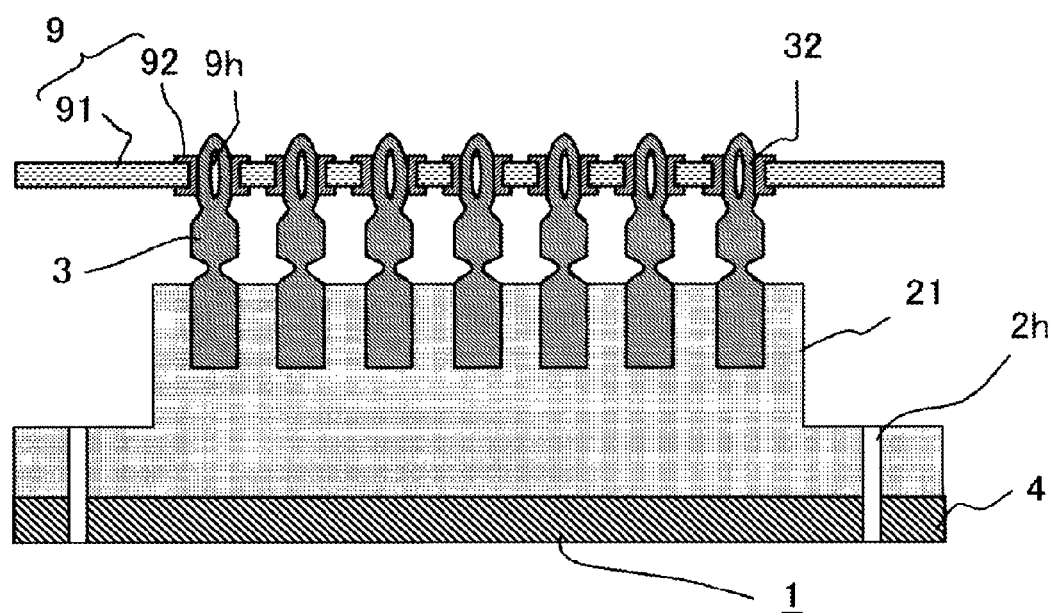
FIG. 3 is a sectional view for illustrating a mounted state in an apparatus of the power semiconductor device according to Embodiment 1 of the invention.
Figure 4:
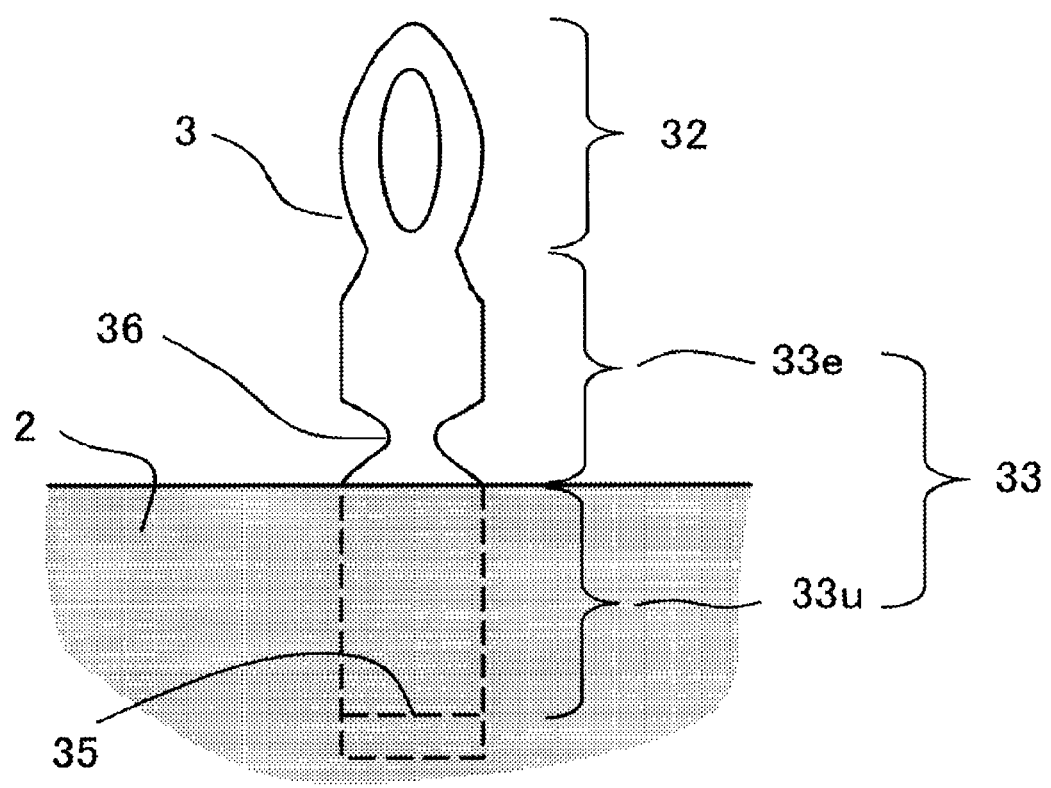
FIG. 4 is a partial side view for illustrating a state of a terminal of the power semiconductor device according to Embodiment 1 of the invention, a part of which is made transparent.
Figure 5:
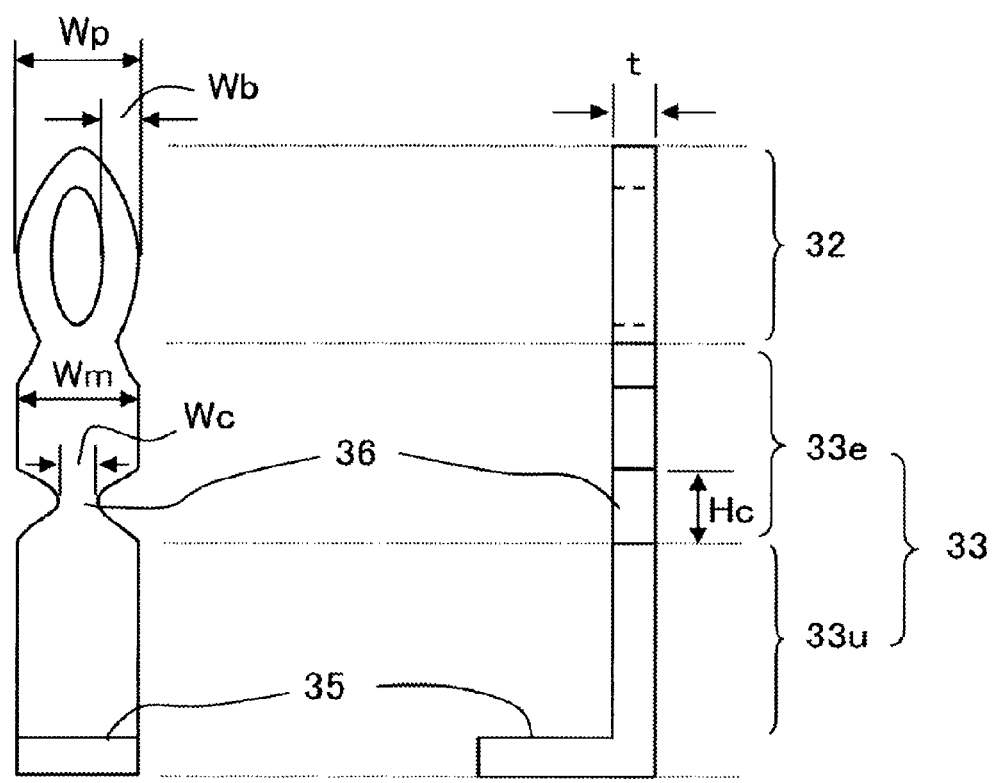
FIG. 5 is a front view and a side view for illustrating a configuration of the terminal used for the power semiconductor device according to Embodiment 1 of the invention.
Figure 6A:
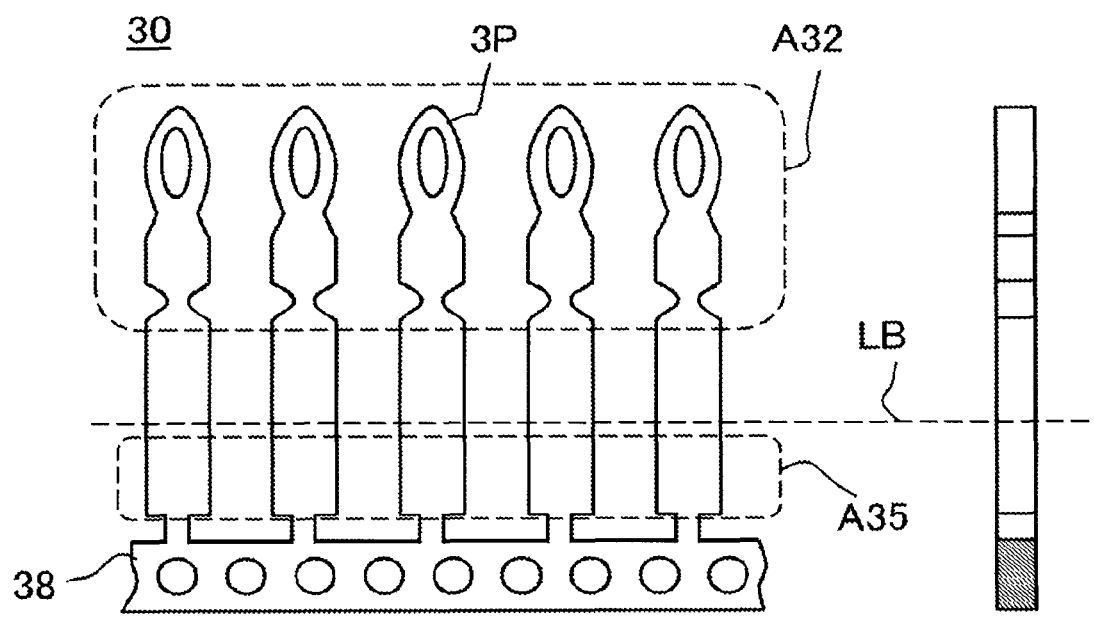
FIGS. 6A and 6B are for illustrating machining steps for the terminals used for the power semiconductor device according to Embodiment 1 of the invention, and includes a front view/sectional view-combined diagram of a frame in each of the steps.
Figure 6B:
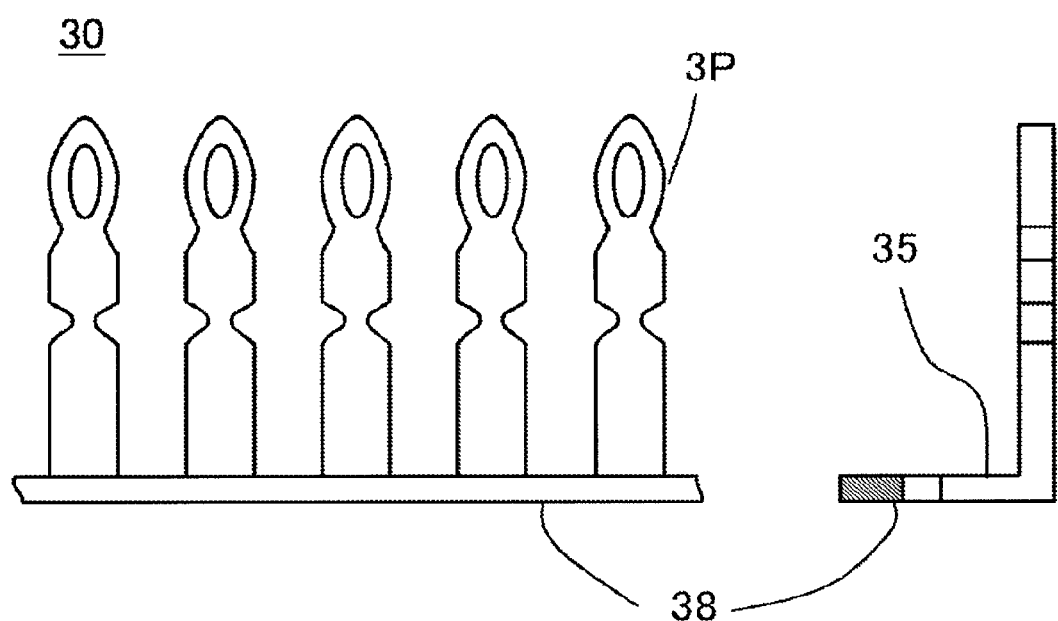
Figure 7:
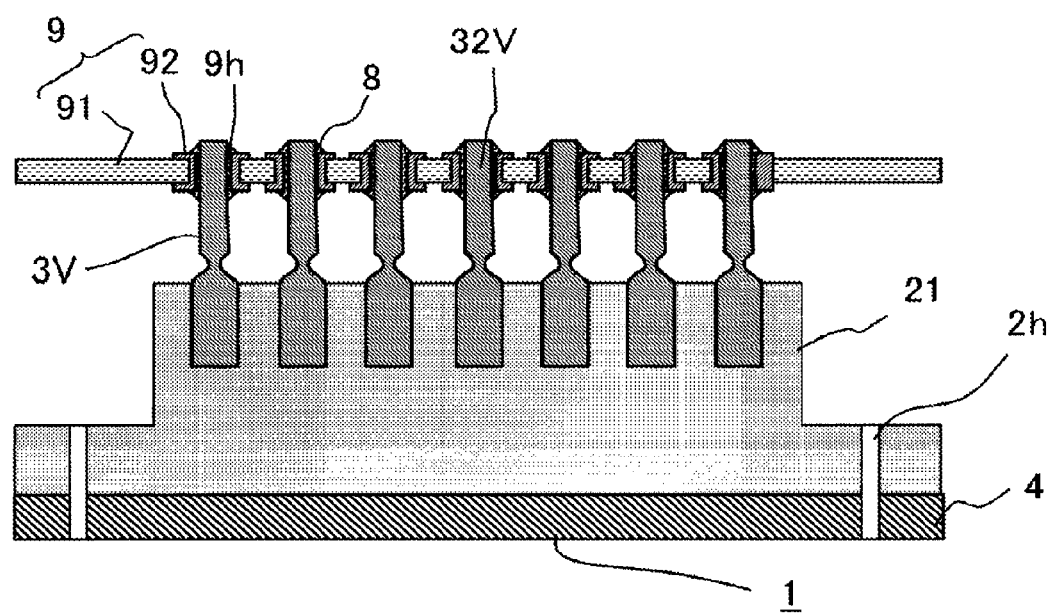
FIG. 7 is a sectional view for illustrating a mounted state in an apparatus of a power semiconductor device according to a modified example of Embodiment 1 of the invention.

FIG. 1 to FIG. 6 are for illustrating a configuration of a power semiconductor device according to Embodiment 1 of the invention, in which FIG. 1(a) and FIG. 1(b) are a plan view and a front view, respectively, showing an outline of the power semiconductor device, FIG. 2 is a sectional view corresponding to A-A line in FIG. 1(a), FIG. 3 is a sectional view corresponding to B-B line in FIG. 1(a) for illustrating a mounted state of the power semiconductor device in an apparatus, FIG. 4 is a partial side view in which, for illustrating a state of terminals in the power semiconductor device, its case portion is made transparent, FIG. 5 is a front view and a side view for illustrating a configuration of the terminal, and FIG. 6 is for illustrating machining steps for the terminals and includes a front view/sectional view-combined diagram (a) before a bending step of a frame (partly shown) serving as a base of the terminals, and a front view/side view-combined diagram (b) after the bending work. Further, FIG. 7 is a sectional view for illustrating a configuration of a power semiconductor device according to a modified example, in which the criterion for drawing the figure is similar to that in FIG. 3. In the followings, description will be made in detail.

First, an outline of a power semiconductor device 1 will be described.

As shown in FIG. 1, the power semiconductor device 1 is provided by being covered with a package 2 (an insert case 21 and a cover 22) as a whole in a state where a base plate 4 is exposed from the lower face side, and in the package 2 (the insert case 21 that constitutes the package), there are formed attaching holes 2h for attaching a heat sink for heat-dissipation to the base plate 4. Meanwhile, on an upper face portion of the power semiconductor device 1, in order to ensure electrical connection with the outside (an apparatus to be connected), a plurality of press-fit terminals 3 serving as terminals are disposed so as to project from the package 2.

Next, description will be made about an internal structure of the power semiconductor device 1.

As shown in FIG. 2, in the power semiconductor device 1, there is placed in the package 2 a circuit board 5 in which a plurality of patterns 52 by copper are formed in the circuit face side (upper side in the figure) of a ceramic base member 51. Onto the heat dissipation face (lower side in the figure) of the circuit board 5, the base plate 4 made of copper is joined using a solder 8, and onto one of the patterns 52 on the circuit face, an IGBT (Insulated Gate Bipolar Transistor) 61 using silicon as semiconductor material and an FwDi (Free-Wheeling Diode) 62 (collectively named "a power semiconductor element 6") are joined using a solder 8. To the upper electrodes of the IGBT 61 and the FwDi 62, a plural number of wires 7 made of aluminum and having a diameter of 200 to 400 μm are wire-bonded, which are connected onto the other patterns 52 or to wire-bond portions 35 formed at portions in the package 2 of the press-fit terminals 3. Note that the inside of the insert case 21 is sealed with a silicone gel 23 and its upper open portion is covered with the cover 22, so that packaging is done.

In the thus-configured power semiconductor device 1, the press-fit terminals 3 projecting from the upper face of the package 2 are, as shown in FIG. 1(a), disposed at predetermined positions in a plane perpendicular to the insertion direction to the apparatus to be connected. Further, as will be explained by a fabrication method described later, their form is such that the terminals linearly arranged along the width direction thereof are disposed. Then, at the time of mounting to an apparatus to be connected, as shown in FIG. 3, press-fit portions 32 serving as external contacts in the press-fit terminals 3 are inserted into through-holes 9h that are contacts in the side of the apparatus to be connected (in the figure, a printed circuit board 9). Inner walls of the through-holes 9h are covered, by copper plating, with conductive materials electrically connected to a plurality of patterns 92 formed on the circuit face of the printed circuit board 9, so that when they become in contact with the inserted press-fit portions 32, electrical connection (conduction) with the power semiconductor device 1 is ensured.

Next, description will be made about a configuration of the press-fit terminal 3 used as a terminal.

For example, as shown in FIG. 4, at one end of the press-fit terminal 3, there is formed the press-fit portion serving as a contact for making conduction with the through-hole 9h when inserted into the aforementioned printed circuit board 9, and at the other end, there is formed the wire-bond portion 35 for performing wire-bonding to a circuit member such as the pattern 52, the power semiconductor element 6 or the like in the power semiconductor device 1. Further, the terminal has a body portion 33 that connects the press-fit portion 32 with the wire-bond portion 35, in which a portion (insert portion 33u) in the body portion 33 placed in the side toward the wire-bond portion 35, and the wire-bond portion 35, are embedded in the package 2 of the power semiconductor device 1, while the other portion (exposed portion 33e) in the body portion 33 supports the press-fit portion 32 so as to place it away from the package 2. A tin plating with nickel underlayer, that is generally used for electrical contacts, is applied to the surfaces of the press-fit portion 32 and the exposed portion 33e, while a bright nickel plating is applied to the wire-bond portion 35 in order to allow aluminum wire-bonding.

With respect to the dimension of the press-fit terminal 3, as shown in FIG. 5, the width Wm of the body portion 33 is 3 mm and the plate thickness t thereof is 1 mm, and the maximum width Wp of the press-fit portion 32 is 2.1 mm. In order to ensure contact to the inner wall of the through-hole 9h, the press-fit portion 32 is provided as a needle-eye shape so as to have a spring property. Namely, the press-fit portion is provided as a doubly supported beam structure in which an opening is formed between a pair of branched portions that are branched from a top-shrinking front end serving as a head in a press-fit direction of the terminal, so as to expand in a direction (=width direction) perpendicular to the press-fit direction and the plate thickness direction, and in which each width Wb of the branched portions is 0.7 mm.

Further, the cross-sectional shape of the press-fit portion 32 follows the shape of the inner wall of the through-hole 9h (cylindrical shape), and round chamfering (R 0.3) is applied to the edges at four corners thereof so that the contact area becomes larger. Note that, in the specification of the through-hole 9h of the printed circuit board 9, the plating thickness is 25 to 50 μm and the finishing diameter is 2.0 mm as inner diameter that is slightly smaller than the maximum width Wp (2.1 mm) of the press-fit portion 32.

Here, at a portion in the body portion 33 of the press-fit terminal 3, that is exposed from the package 2 (the exposed portion 33e, or a boundary portion between the exposed portion 33e and the press-fit portion 32), there is formed a constriction portion 36 that is concaved from both sides in the width direction. The concave shapes from both sides for forming the constriction portion 36 are left-right symmetric and are the same in open length (height, in the figure) Hc and in depth. In the constriction portion of the press-fit terminal 3 used in the power semiconductor device 1 according to Embodiment 1, the open length Hc is 1 mm and the depth is 1.2 mm, and chamfering of R 0.5 is applied to the tips in order to prevent local stress concentration. This results in the (residual wall) width We at the constriction portion 36 of 0.6 mm (Wm−1.2 mm×2) that is narrower than the width Wb (0.7 mm) of the branched portion.

Here, a flow of fabricating the power semiconductor device 1 having the aforementioned press-fit terminals 3 will be described.

The press-fit terminals 3 are formed from a frame 30 which is made from a metal plate member with a thickness of 1 mm by press working using a plurality of progressive dies, and in which, as shown in FIG. 6(a), terminal units 3P serving as the base of the press-fit terminals 3 are coupled together by a tie bar 38. As to the frame 30, in the coupled state of the respective terminal units 3P, an under-layer nickel plating and upper-layer tinplating with a thickness around several μm is applied to an area A32 corresponding to the press-fit portions 32 and the exposed portions 33e, while a bright nickel plating is applied to an area A35 corresponding to the wire-bond portions 35. Thereafter, as shown in FIG. 6 (b), in order to form wire-bond pads (wire-bond portions 35), a bending work is applied at LB portion still in the coupled (integrated) state by the tie bar 38.

Thereafter, in the state where a given number of the terminal units 3P are coupled together by the tie bar 38, the frame 30 is inserted into an insert mold, so that the insert case 21 is molded by injection molding in which the frame 30 is embedded such that the press-fit portions 32 and the wire-bond portions 35 are exposed therefrom. Note that, at this time, because the respective terminal units 3P are coupled (integrated) together by the tie bar 38, the insertion into the insertion mold becomes easier. Then, after injection molding, the tie bar 38 is separated off, so that the insert case 21 in which the press-fit terminals 3 are arranged at the predetermined positions is completed.

Then, the base plate 4 with the power semiconductor element 6, etc. soldered thereon and the insert case 21 are adhered together by an adhesive, and the circuit members such as the power semiconductor element 6, the patterns 52 and the like are connected with the wire-bond portions 35 of the press-fit terminals 3 by wire-bonding. Finally, the circuit face is sealed with the silicone gel 23 followed by adhesion of the cover 22, so that packaging is done to thereby complete the power semiconductor device 1.

Next, the operation will be described.

As described using FIG. 3, the power semiconductor device 1 is used as it is attached to an apparatus, such as the printed circuit board 9, in which contacts matched to the press-fit terminals 3 are formed. Here, the power semiconductor device 1 and the printed circuit board 9 are, in their use, exposed to severe environments, such as a temperature change, a vibration and the like. When the power semiconductor device 1 is exposed to such environments, because of a temperature change during use, a displacement occurs repeatedly between the arrangement of the press-fit terminals 3 of the power semiconductor device 1 and the arrangement of the contacts of the printed circuit board 9, due to the difference between the linear expansion coefficient of the printed circuit board 9 (approx. 13 ppm/K) and the linear expansion coefficient of the power semiconductor device (the linear expansion coefficient of the package 2: approx. 5 ppm/K).

On this occasion, if in the case of conventional semiconductor device as described, for example, in Patent Document 1, a copper cylinder used as the terminal is required to be made thicker in diameter according to the current density. The thicker the diameter, the higher the rigidity becomes, so that if a displacement occurs, a stress is repeatedly imposed on the contacts of the printed circuit board 9 or the power semiconductor device 1. This makes it difficult to apply the terminal to a larger-size power semiconductor device and to use it in more severe environments.

However, in the power semiconductor device 1 according to Embodiment 1, at a portion (the exposed portion 33e) that is in the body portion 33 connecting the press-fit portion 32 and the insert portion 33u of the press-fit terminal 3 and that is exposed from the package 2, there is formed the constriction portion 36 having the thickness We that is narrower than the width Wb of the branched portion in the press-fit portion 32. Thus, even if such a displacement occurs repeatedly, the constriction portion 36 preferentially deforms so that the press-fit portion 32 moves right/left in the width direction of the terminal centering on the constriction portion 36. Therefore, the stress can be suppressed from being imposed on the contacts or the power semiconductor device 1. Namely, it becomes possible to provide the power semiconductor device 1 that is highly reliable.

Meanwhile, as described using FIG. 5, press-fit connection is a technique of press-fitting the press-fit terminal 3 that is slightly wider than the diameter of the through-hole 9h of the printed circuit board 9 to produce a mechanical contact force between the press-fit portion 32 and the through-hole 9h to thereby electrically connect both of them together. Thus, if there is a relative positional deviation between the through-hole 9h and the press-fit terminal 3, in the branched portions forming the press-fit portion 32, only one of them may hit the inner wall of the through-hole 9h at the time of starting insertion to cause a plastic deformation, so that the spring property is impaired thus making the contact force difficult to act. Accordingly, for the arrangement of the through-holes 9h of the printed circuit board 9 serving as the contacts of the apparatus to be connected, a high positional accuracy is required.

However, in accordance with the power semiconductor device 1 according to Embodiment 1, even if a relative positional deviation becomes larger between the through-hole 9h and the press-fit terminal 3, the constriction portion 36 deforms to absorb the relative positional deviation, so that it is possible to suppress the press-fit portion 32 from causing a plastic deformation excessively. As a result, the power semiconductor device 1 becomes able to be easily mounted to the printed circuit board 9.

Note that, the aforementioned effect is achievable when, with respect to a stress in a direction perpendicular to the insertion direction, the rigidity of the constriction portion 36 is lower than the rigidity of the press-fit portion 32. Specifically, it is achievable when the width Wc of the constriction portion 36 is smaller than the width Wb of one side of the branched portions, that is a width representative of the press-fit portion 32. Namely, this is because that, when the width Wc of the constriction portion 36 is wider than the width Wb of the one side of the branched portions that constitute the press-fit portion 32, if a positional deviation occurs between the printed circuit board 9 and the press-fit portion 32, the press-fit portion 32 plastically deforms largely before the constriction portion 36 plastically deforms; thus, the spring property at the press-fit portion 32 is impaired, so that the contacts cannot ensure a predetermined electric property.

Modified Example in Embodiment 1

Note that in this Embodiment, description has been made about the case of using, as a terminal, the press-fit terminal 3 by which the aforementioned effect emerges significantly; however, this is not limitative. For example, even in the case of using a pin terminal 3V as shown in FIG. 7 in which a soldering contact 32V is formed in a flat-plate shape for soldering, it suffices to realize such a form that the rigidity of the constriction portion 36 is lower than the rigidity of the soldering contact 32V.

Namely, in portions of the pin terminal 3V exposed from the package 2, at a portion extending until the soldering contact 32V (the exposed portion 33e, or a boundary portion between the exposed portion 33e (body portion 33) and the soldering contact 32V), there is formed a constriction portion 36 having the width We that is narrower than the representative width of the soldering contact 32V (here, simply, the width of the flat-plate portion). This produces the following effect.

In the case of pin terminals 3V for soldering, because of a temperature change when the power semiconductor device 1 is used, there may be cases where a crack occurs at the soldered portion due to the difference in linear expansion coefficient between the power semiconductor device 1 and the printed circuit board 9; however, the constriction portion 36 absorbs the stress due to the difference in linear expansion coefficient, so that stress imposed on the contact portion and the inside of the power semiconductor device 1 is reduced and thus the reliability is enhanced. Meanwhile, the pin terminal 3V is soldered to the printed circuit board 9 using a soldering iron in some cases, and at that time, a heat input time with respect to heat input from the soldering iron should be long because the heat will escape toward the power semiconductor device 1. For dealing with this problem, the constriction portion 36 prevents the heat from escaping, so that the heat input time can be shortened.

In the case of the terminal, such as the press-fit terminal 3 and the pin terminal 3V, that is formable from a plate member, the constriction portion 36 is shapeable by punching, so that it can be machined at the same time when a punching pattern serving as the base of the terminals (in this Embodiment, the frame 30) is shaped. Thus, almost no cost increase occurs for forming the constriction portion 36.

Note that, as the material of the terminal, a material with an electrical resistivity that is nearer to oxygen-free copper is particularly better among copper family materials. Further, when a proper repulsion force is required like the press-fit terminal 3, it is preferable to be a material with a high spring property having a high rigidity. As a material that satisfies such properties there is a copper-zinc alloy (an electric conductivity of 80%; an elastic modulus of 140 GPa).

Further, in this Embodiment, description has been made with reference to the case of the power semiconductor device 1 of an insert case type that is sealed with the silicone gel 23; however, even in the case of the power semiconductor device of a transfer mold type that is covered with a mold resin as a whole, it is possible to produce an effect similar to the above.

Note that, the dimensions of the terminal (press-fit terminal 3) and the through-hole 9h may be different to those of the above, and how to connect the terminal with the contact in the side of the apparatus to be connected may be another manner. However, it is only required that at least the width We of the constriction portion 36 be narrower than the representative width of the terminal (in this Embodiment, the width Wb of one side of the branched portions in the press-fit portion 32, or the width of the pin terminal 3V).

Further, it is not necessarily required that the end portion in the side placed in the package 2 be the wire-bond portion 35, and it may instead have a press-fit form or a pin terminal form. Even in this case, forming the aforementioned constriction portion 36 at a portion, such as the exposed portion 33e, not held by the package 2, produces an effect similar to the above.

As described above, in accordance with the power semiconductor device 1 according to Embodiment 1 of the invention, it is configured to include: a housing (package 2); the circuit board 5 which is placed in the housing (package 2) and in which an electric circuit including the power semiconductor element 6 is formed;
the plurality of terminals (press-fit terminals 3 or pin terminals 3V) each having an inner terminal portion (wire-bond portion 35) electrically connected in the housing (package 2) to the electric circuit, an outer terminal portion (press-fit portion 32 or soldering contact 32V) for making electrical connection with an apparatus to be connected (for example, printed circuit board 9), and the body portion 33 whose one end (insert portion 33u) continuous to the inner terminal portion (wire-bond portion 35) is fastened internally to the housing (package 2) and which supports the outer terminal portion (press-fit portion 32 or soldering contact 32V) at the other end (exposed portion 33e) so as to place the outer terminal portion away from the housing (package 2); wherein, in each of the plurality of terminals (press-fit terminals 3 or pin terminals 3V), at a portion (exposed portion 33e) in the body portion 33 exposed from the housing, there is formed the constriction portion 36 having a rigidity lower than the rigidity of the outer terminal portion (press-fit portion 32 or soldering contact 32V). Thus, even if a displacement due to temperature change, a placement error, etc. occurs, the constriction portion 36 deforms preferentially so that the press-fit portion 32 or the soldering contact 32V moves right/left in the width direction of the terminal centering on the constriction portion 36. Therefore, stress can be suppressed from being imposed on the contact or the power semiconductor device 1. Namely, it becomes possible to provide the power semiconductor device 1 that is highly reliable.

In particular, the terminals (press-fit terminals 3) are each formed of an elongated plate member; the outer terminal portion (press-fit portion 32) is formed in a doubly supported beam structure in which its branched portions in the width direction of the plate member are facing to each other with a gap therebetween; and the constriction portion 36 is configured to have the width We that is narrower than the width Wb of each of the branched portions of the outer terminal portion (press-fit portion 32). Thus, the constriction portion 36 deforms to absorb the relative positional deviation, making it possible to suppress the press-fit portion 32 from causing a plastic deformation excessively. As a result, electrical connection is well established at the contacts, and the power semiconductor device 1 becomes able to be easily mounted to the printed circuit board 9.

Embodiment 2

Figure 8A:
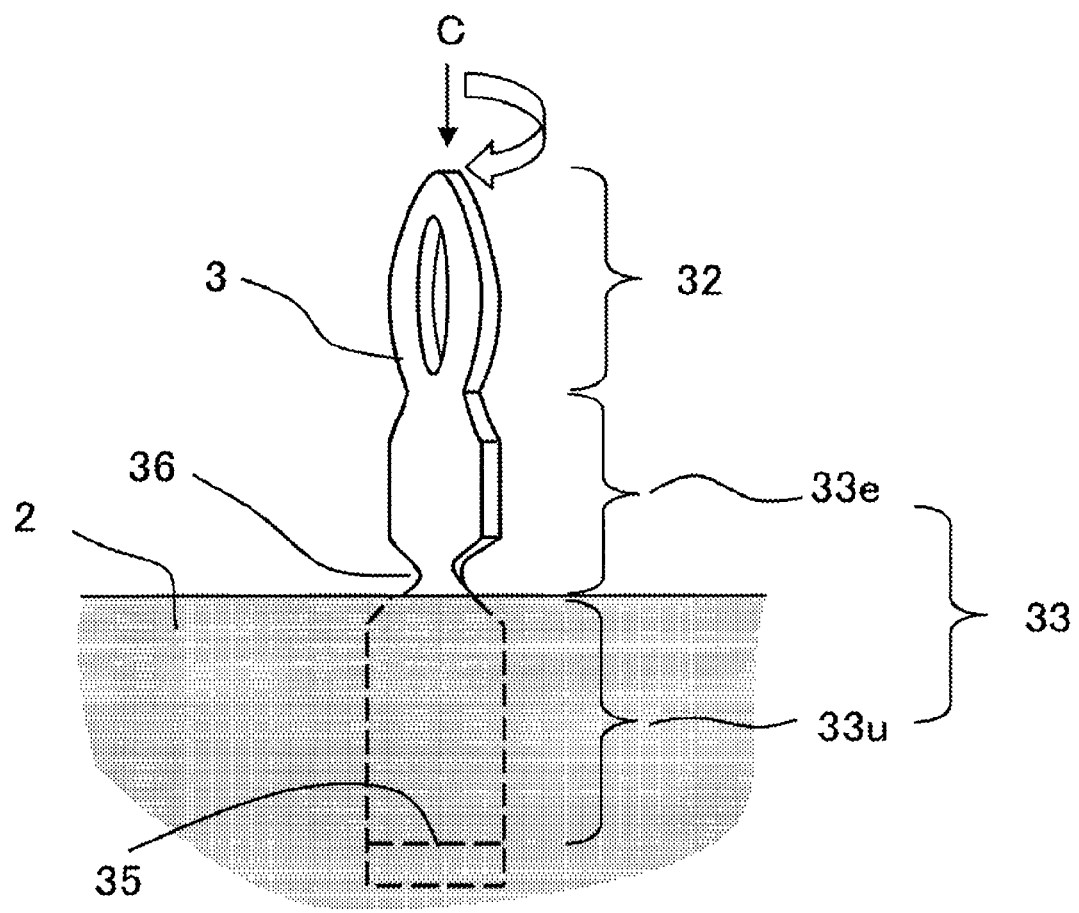
FIGS. 8A and 8B are a partial side view for illustrating a state of a terminal of a power semiconductor device according to Embodiment 2 of the invention, a part of which is made transparent, and a partial plan view for illustrating a state of adjacent terminals thereof.
Figure 8B:
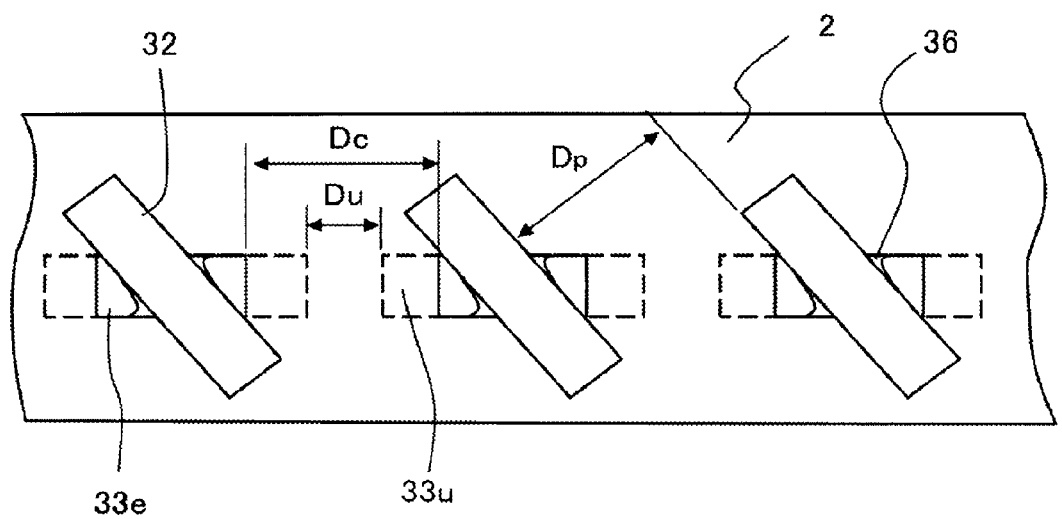

In contrast to the power semiconductor device described in Embodiment 1, a power semiconductor device according to Embodiment 2 is configured so that the constriction portion of the terminal is partly embedded in the case and the upper side thereof from the constriction portion is twisted. FIG. 8 is for illustrating the configuration of the power semiconductor device according to Embodiment 2, in which FIG. 8(a) is a partial side view in which, for illustrating a state of the terminals, its case portion is made transparent and FIG. 8(b) is a partial plan view for illustrating a state of adjacent terminals when viewed from a viewpoint C in FIG. 8(a). The other basic configuration as the power semiconductor device is the same as that of the power semiconductor device of Embodiment 1, so that its description is omitted here.

As shown in FIG. 8, in the press-fit terminal 3 as a terminal, the constriction portion 36 similar to that in Embodiment 1 is formed; however, in Embodiment 2, the constriction portion 36 partly overlaps with the insert portion 33u embedded in the package 2. Further, the press-fit portion 32-side bordered by the constriction portion 36 (at around the constriction center, exactly) is twisted (rotated) by 45 degrees around an axis at a center with respect to the width direction and the thickness direction, so as to be tilted relative to the insert portion 33u, namely, relative to the arrangement direction.

Note that this structure can be achieved by applying bending work to the portion exposed from the insert case 21 after injection molding of the insert case 21 described in Embodiment 1. This is because the frame 30 whose respective terminal units 3P have been subjected to the working in twist direction, for example, is difficult to use in the injection molding, in view of the configuration of the mold therefor.

Next, the reason of applying such a configuration will be described.

A terminal of a plate member, such as the press-fit terminal 3, is larger in size in the width direction (for example, in FIG. 5, Wm) than in the thickness direction (ditto, t). Thus, when arranging the press-fit terminals 3, if their pitch is to be narrowed while keeping the interval between the adjacent press-fit terminals 3, speaking of extremes, it suffices to arrange the respective press-fit terminals 3 in the plate thickness direction.

However, actually, in order for example to ensure a work space at the wire-bonding, the respective press-fit terminals 3 are arranged in the direction parallel to their faces so as not to overlap in the thickness direction of the plate member. Further, the insert molding is performed in the state where the respective terminal units 3P are coupled together in the aforementioned frame 30, the respective press-fit terminals 3 are necessarily arranged in a line along the width direction.

Thus, in Embodiment 2, with respect to the portions exposed from the package 2, their faces are tilted relative to the arrangement direction after insert molding. By applying this structure, as shown in FIG. 8(b), the arrangement pitch can be reduced while keeping at a predetermined degree or more, the interval Dp between the adjacent press-fit terminals 3 at their portions exposed from the package 2. At that time, the interval Du between the insert portions 33u becomes shorter; however, since the package 2 comprises an insulating material, it is allowed to have a spatial distance shorter than the spatial distance required for the exposed portions. At that time, since a part of the constriction portion 36 is embedded in the package 2, twisting action is not applied to that part, so that the width direction and the arrangement direction of the terminal at that part are matched to each other, and the portion exposed from the package 2 is only a portion (interval=Dc) having a width narrower than the width Wm of the press-fit terminal 3 itself. Namely, the spatial distance ensured by the portions exposed from the package 2 is either Dc or Dp that is shorter than the other.

Accordingly, the spatial distance between the press-fit terminals 3 can be made larger while keeping a narrow pitch, thus making it possible to provide a compact and high-breakdown-voltage power semiconductor device. Further, because of the bending work at through the constriction portion 36, there is provided an effect of suppressing a stress from being produced excessively in the resin part of the insert case 21. Note that the tilt is not limited to 45 degrees. For example, although it may be set appropriately by an angle of 90 degrees or less but large than 0 degree, an angle that establishes Dp≥Dc is preferable.

As described above, in accordance with the power semiconductor device 1 according to Embodiment 2, the terminals (press-fit terminals 3 or pin terminals 3V) are each formed of an elongated plate member and are disposed along a width direction of a portion of the plate member (insert portion 33u) included in the body portion 33 and internally fastened to the housing (package 2), wherein, in the portion (exposed portion 33e) exposed from the housing (package 2), a portion beyond the constriction portion 36 (press-fit portion 32 or soldering contact 32V-side) is tilted relative to the width direction. Thus, the spatial distance between the terminals (press-fit terminals 3 or pin terminals 3V) can be made larger while keeping a narrow pitch, thus making it possible to provide a compact and high-breakdown-voltage power semiconductor device.

As described above, in accordance with the power semiconductor device 1 according to Embodiment 2, the terminals (press-fit terminals 3 or pin terminals 3V) are each formed of an elongated plate member and are disposed along a width direction of a portion of the plate member (insert portion 33u) included in the body portion 33 and internally fastened to the housing (package 2), wherein, in the portion (exposed portion 33e) exposed from the housing (package 2)

Note that, in Embodiments 1 and 2, description has been made about the case where silicon is used as the semiconductor material for the power semiconductor element 6 that functions as a switching element (transistor: IGBT 61) and a rectifier element (diode: FwDi 62). However, as described below, the effect by the invention can be more produced in comparison with that case, when silicon carbide, a gallium nitride family material or diamond is used that can form a so-called wide bandgap semiconductor having a bandgap larger than that of silicon.

Namely, when a power semiconductor element using a wide bandgap semiconductor material such as silicon carbide or a gallium nitride family material is used, the entire temperature of the power semiconductor device 1 becomes much higher and thus the displacement relative to the connected apparatus such as the printed circuit board 9 becomes larger, so that the stress-relaxation effect by the constriction portion 36 becomes significant.

Further, in the power semiconductor device that mounts the power semiconductor element of a wide bandgap semiconductor material, because its terminals also reach a high temperature, when contacts between the terminals and the connected apparatus are made by solder joint, the solder joint reliability is reduced in some cases. Further, according to enhancement in current density of the power semiconductor device, the current caused to flow in the terminals becomes also a large current and an amount of heat generation at the contact portions increases as well, so that the solder joint reliability is reduced in some cases. In these cases, by adopting a terminal without the need of solder joint, such as the press-fit terminal 3, it became possible to cause the power semiconductor element to operate at a temperature higher than the melting point of the solder.

Further, the press-fit portion 32 has an electrode contact area that is smaller than that in the case of soldering (for example, the soldering contact 32V in the pin terminal 3V), so that the thermal resistance between the press-fit terminal 32 and the through-hole 9h becomes larger. Thus, when the press-fit terminal 3 is used as the terminal, it is possible to suppress heat transfer from the power semiconductor device 1 to the printed circuit board 9, so that heat in the power semiconductor element 6 becomes not easily transferable to the side of the connected apparatus (printed circuit board 9). Namely, even if the temperature of the power semiconductor device 1 becomes a high temperature, the temperature of the connected apparatus is not easily raised, so that the reliability of the connected apparatus is enhanced.

Embodiment 3

Figure 9A:
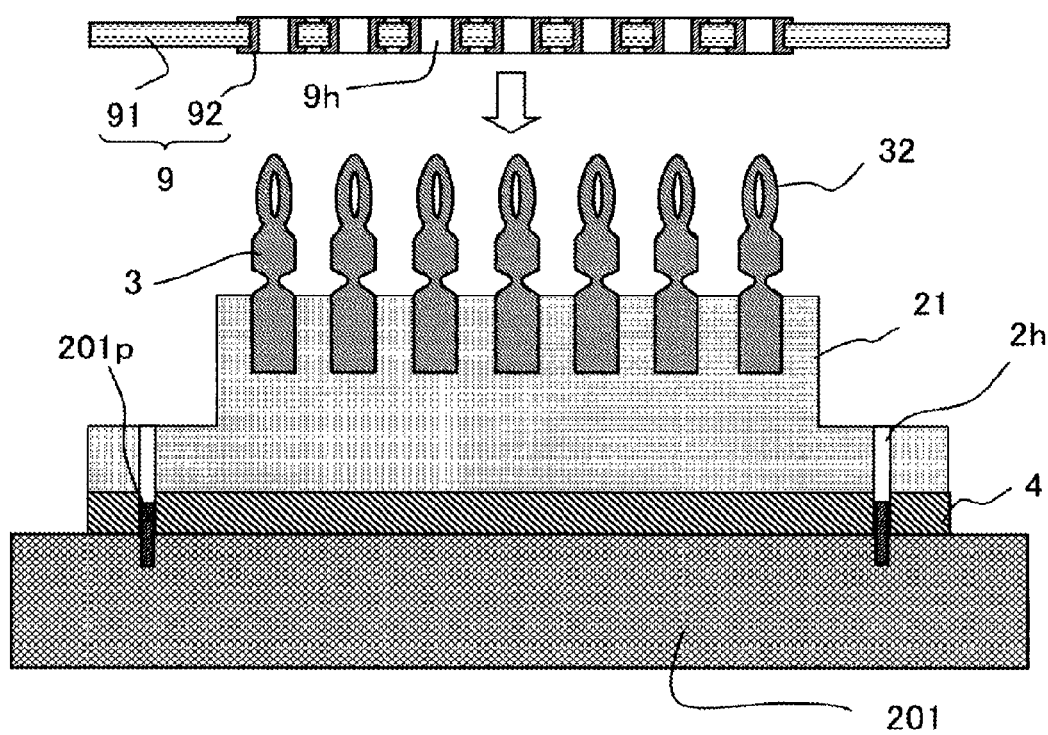
FIGS. 9A and 9B are sectional views each for illustrating a step of attaching a power semiconductor device according to Embodiment 3 of the invention with a printed circuit board.
Figure 9B:
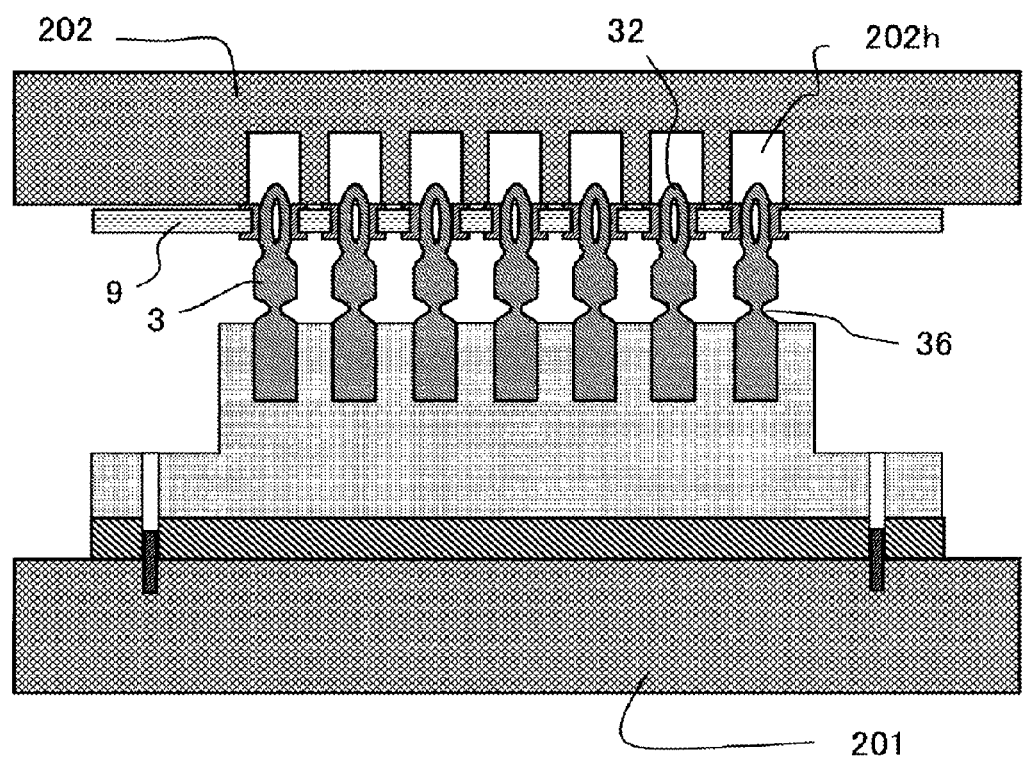

In Embodiment 3, description will be made about a method (an apparatus attaching method) of connecting the power semiconductor device with the printed circuit board which are described in each of aforementioned Embodiments 1 and 2. Further, an action of the press-fit terminal at the time of connection that is due to the structure of the constriction portion will be described. FIGS. 9(*a*) and (*b*) are for illustrating the apparatus attaching method according Embodiment 3, and are sectional views each showing a state in each step in the attaching method of the power semiconductor device with the printed circuit board, in which the sectioned position is similar to in FIG. 2.

Note that the apparatus attaching method according to Embodiment 3 is an attaching method that takes advantage of a feature of the power semiconductor device 1 that uses the press-fit terminal 3 described in Embodiments 1 and 2. Namely, the method is based on the premise that in the body portion 33 of the press-fit terminal 3, the constriction portion 36 is formed from both ends in the width direction and at the same position in the longitudinal direction, so as to leave the material at the center in the width direction. Accordingly, the other configuration is similar to that described in Embodiment 1 or 2, so that its description is omitted here. Note that, as the power semiconductor device itself, here is shown a device in the form described in Embodiment 1 and shown in FIG. 1 to FIG. 6; however, needless to say, a device in the form described in Embodiment 2 and shown in FIG. 8 is also applicable.

As shown in FIG. 9(*a*), when attaching the printed circuit board 9 to the power semiconductor device 1, the power semiconductor device 1 is installed at a predetermined place of a lower jig 201 placed in the lower mold of an unshown pressing machine so that the press-fit terminals 3 as outer terminals are directed upward. At that time, positioning of the semiconductor device 1 is made by, for example, pins 201p formed on the lower jig 201 and attaching holes 2h, etc. Then, the printed circuit board 9 is provisionally attached onto the upper face of the press-fit terminals 3 while matching the positions of the press-fit terminals 3 (arrangement thereof) and the through-holes 9h (arrangement thereof) to each other.

Then, an upper jig 202 placed in the upper mold of the unshown pressing machine is caused to move toward the lower jig 201. At this time, in the upper jig 202, as shown in FIG. 9 (*b*), there are formed cavities 202h at portions corresponding to the through-holes 9h. Thus, even when the head of the press-fit terminal 3 passes through the through-hole 9h to become in a state of projecting from the printed circuit board 9, there is no case where the head is in contact with the pressing face of the upper jig 202, so that the printed circuit board 9 can be pressed downward until its required position (press-fitted). This allows the press-fit portion 32 of each of the press-fit terminals to be inserted up to a predetermined position in the through-hole 9h, so that attaching the power semiconductor device 1 with the printed circuit board 9 is completed.

In such an attaching method, if the constriction is instead formed from only one side of the body portion, this portion is allowed to bend only toward the constriction-existing side, so that, though depending on the direction of a positional deviation between the terminal and the through-hole, it becomes difficult to follow the deviation. Further, if the constriction from the one side is formed to reach a state where no material exists at the center axis, the portion will bend toward the constriction-existing side merely by a force applied in a vertical direction (insertion direction) thereto. In that case, if the press-fit terminals themselves are not individually supported as done for the press-fit terminals described, for example, in Patent Document 2, their insertion into the through-holes becomes difficult. Further, since power semiconductor devices have a large number of terminals and, in addition, have a variety of arrangements for the terminals, it is extremely difficult to prepare such a jig that supports or presses a plurality of terminals. Further, according to the structure like the bent portion disclosed, for example, in Patent Document 2, a long narrow current path is formed thus making the electrical resistance larger, so that it is not suited for a large current flow.

However, the attaching method according to this Embodiment is based on the premise that in the body portion 33 of the press-fit terminal 3, the constriction portion 36 is formed from both ends in the width direction so as to leave the material at the center in the width direction. Thus, at the time of insertion into the through-hole 9h, the constriction portion 36 does not cause a buckling deformation merely by a force applied in a vertical direction to the press-fit terminal 3, and a portion where the current path is narrowed is limited. At the same time, it is possible to cause the constriction portion 36 to easily deform to either right or left with respect to the width direction that is a direction perpendicular to the insertion direction, so that the ability to follow a positional deviation is ensured. Accordingly, it becomes possible to properly attach the power semiconductor device 1 to the printed circuit board 9 with good productivity.

Note that, in the condition for the above premise, based on the features of the press-fit terminals 3 of Embodiments 1 and 2, the body portion 33 is determined to have the constriction portion 36 that is formed from both ends in the width direction and at the same position in the longitudinal direction, so as to leave the material at the center in the width direction. However, as the condition to achieve the aforementioned effect, it suffices that constrictions are made from both sides in a direction perpendicular to the longitudinal direction and at the same position in the longitudinal direction, so as to leave the center. More exactly speaking, it is just enough that constrictions are formed so that a residual wall is left at both sides of a center line (center axis of the body portion 33) that connects the press-fit portion 32 and the root of the exposed portion 33$e$, that is, a center axis in the insertion direction. At that time, the constrictions are not necessarily right-left symmetric, for example. Further, they may be in a form constricted from both sides in the thickness direction, for example.

Figure 10:
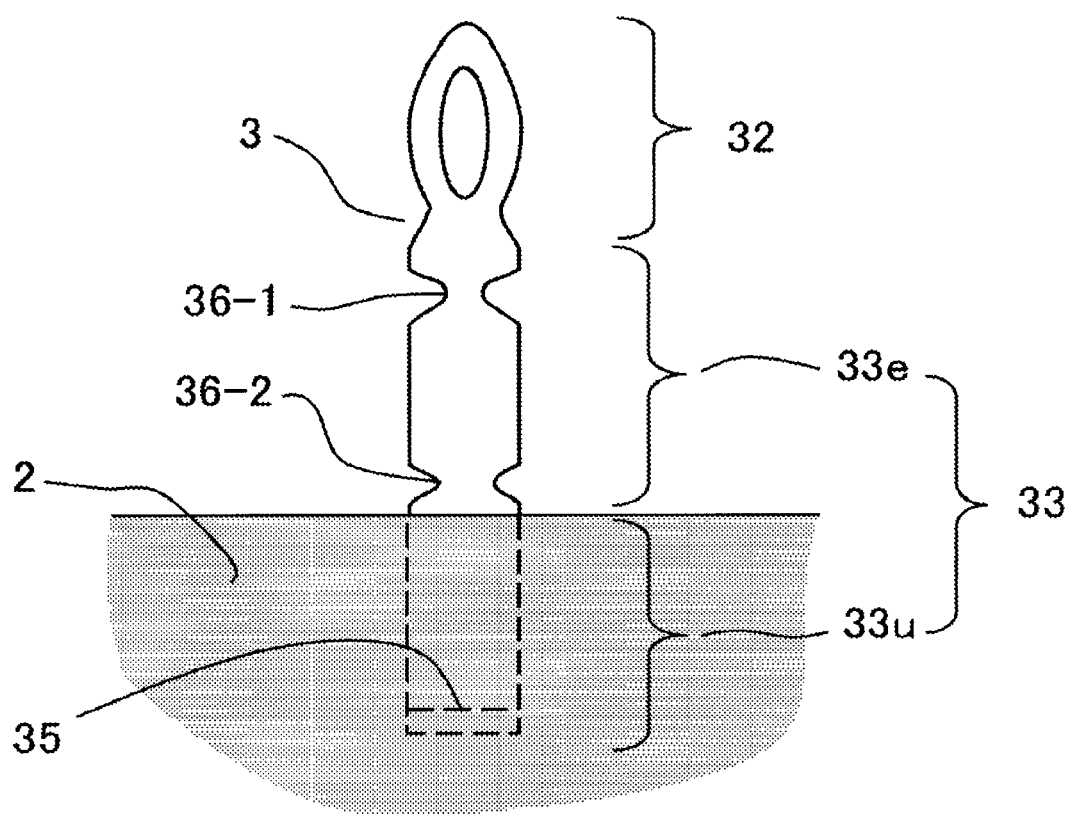
FIG. 10 is a partial side view for illustrating a state of a terminal of a power semiconductor device according to a modified example of Embodiment 3 of the invention, a part of which is made transparent.
Figure 11:
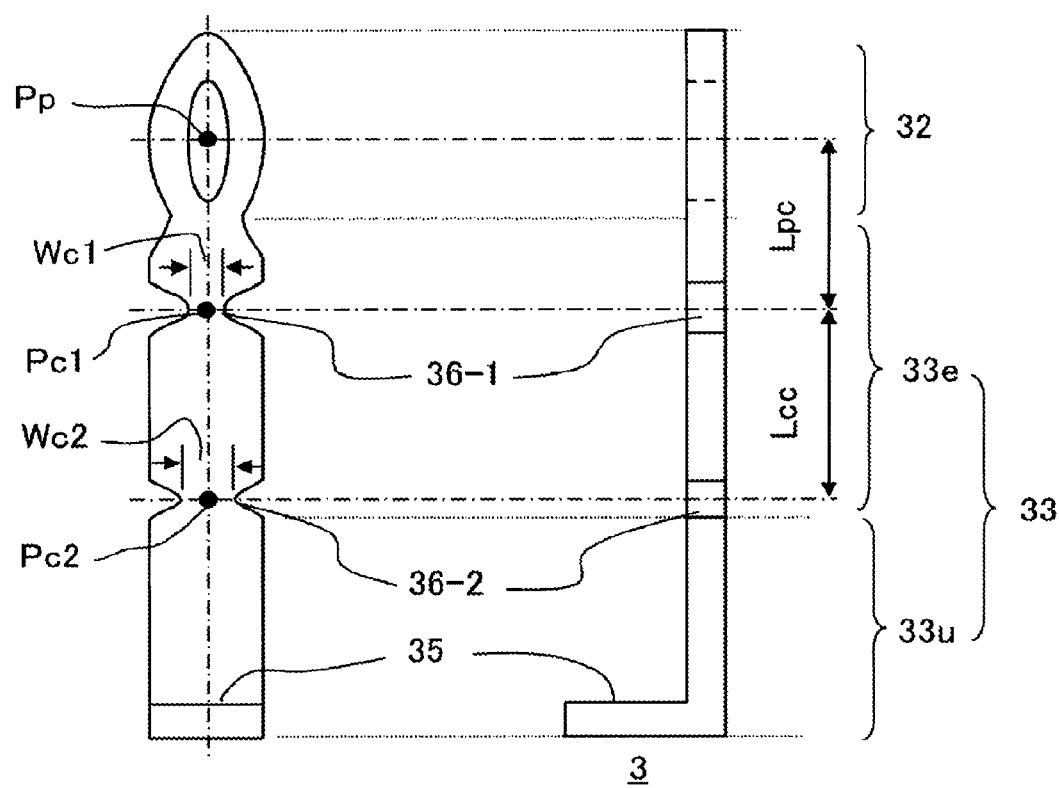
FIG. 11 is a front view and a side view for illustrating a configuration of the terminal used for the power semiconductor device according to the modified example of Embodiment 3 of the invention.
Figure 12A:
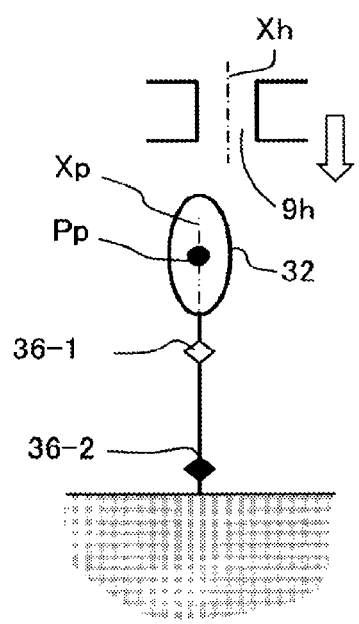
FIGS. 12A-12C are a schematic diagram showing a deformed state of a terminal for every depth of the terminal inserted in a through-hole when a printed circuit board is attached to the power semiconductor device according to the modified example of Embodiment 3 of the invention.
Figure 12B:
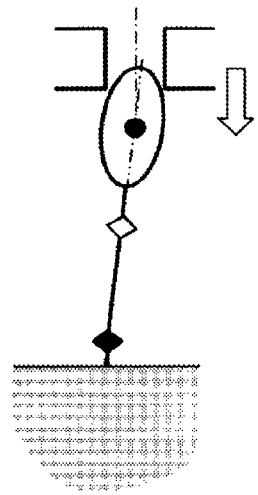
Figure 12C:
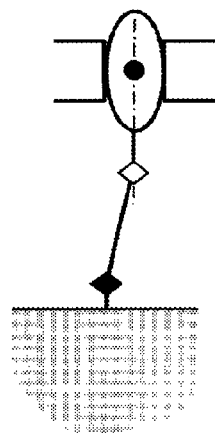

Furthermore, in Embodiment 3, a modified example of the terminal shape suited to the above attaching method will be described. FIG. 10 to FIG. 12 are for illustrating the configuration of a power semiconductor device according to the modified example of Embodiment 3, in which FIG. 10 is a partial side view for illustrating a state of the press-fit terminal of the power semiconductor device, apart of which is made transparent; FIG. 11 is a front view and a side view for illustrating the configuration of the press-fit terminal; and FIG. 12 is a schematic diagram showing a deformed state of the terminal for every depth of the terminal inserted in the through-hole when the printed circuit board is attached to the power semiconductor device.

In the press-fit terminal 3 used in the power semiconductor device 1 according to this modified example, as shown in FIG. 10, there are formed the constriction portions 36-1, 36-2 at different positions (two places) in the longitudinal direction (insertion direction) of the exposed portion 33$e$. Each of the constriction portions 36-1 and 36-2, of course, satisfies the aforementioned condition that the residual wall exists at both sides of the center axis. Further, as shown in FIG. 11, the two constriction portions 36-1 and 36-2 are formed so that the width Wc2 of the constriction portion 36-2 that is farther from the press-fit portion 32 is wider than the width Wc1 of the nearer one (36-1). In addition, with respect to the longitudinal direction, they are formed so that in comparison to the distance Lpc between the center position Pp of the press-fit portion 32 and the constriction portion 36-1 (center position Pc1), the distance Lcc between the constriction portion 36-1 and the constriction portion 36-2 (center position Pc2) is longer.

Next, description will be made using FIG. 12 about an action when the power semiconductor device 1 using the press-fit terminal 3 according to this modified example and the printed circuit board 9 are attached together by the aforementioned attaching method. Note that shown in the figure is the case where the position of the press-fit terminal 3 that is a part of the plurality of press-fit terminals 3 is deviated relative to the through-hole 9$h$ of the printed circuit board 9, and is an action at the time of insertion of the press-fit terminal 3 in which the positional deviation occurs. For that showing, in order to indicate the deformed state simply, there are shown in an extracted manner, the position of the through-hole 9$h$, the center Pp and the direction of the press-fit portion 32, the constriction portion 36-1 (center position Pc1) that is nearer to the press-fit portion 32, and the constriction portion 36-2 (center position Pc2) that is farther thereto.

As shown in FIG. 12($a$), the center axis Xp of the press-fit terminal 3 and the center axis Xh of the through-hole 9$h$ are parallel-deviated in the direction perpendicular to the insertion direction, and in this state, the through-hole 9$h$ is lowered toward the press-fit terminal 3. This causes the press-fit portion 32 to be guided by the through-hole 9$h$ to thereby incline relative to the axis of the through-hole 9$h$ as shown in FIG. 12($b$). On this occasion, the more the position becomes distant from the center Pp of the press-fit portion 32, the larger the torque becomes, so that the constriction portion 36-2 farthest from the press-fit portion 32 bends firstly.

When the printed circuit board 9 is further lowered, as shown in FIG. 12($c$), the press-fit portion 32 is entered into the through-hole 9$h$, so that the inclination is corrected along the inner wall of the through-hole 9$h$. At that time, since the width Wc1 of the constriction portion 36-1 is made narrower than the width Wc-2 of the constriction portion 36-2, the constriction portion 36-1 can deform easily, so that the direction of the press-fit portion 32 and the direction of the through-hole 9$h$ can be matched to each other.

As described above, in accordance with the power semiconductor device 1 according to the modified example of Embodiment 3, since the two-place constriction portions 36-1, 36-2 are provided at different positions in the longitudinal direction, it is possible to deal with a positional deviation as well as to cause the inclination of the press-fit portion 32 to become directed along the through-hole 9$h$.

Furthermore, since the width Wc1 of the constriction portion 36-1 that is nearer to the press-fit portion 32 is made narrower than the width Wc2 of the constriction portion 36-2 that is farther thereto, the inclination of the press-fit portion 32 during the later period of insertion can be corrected easily.

Further, since in comparison to the distance Lpc between the press-fit portion 32 (center position Pp) and the constriction portion 36-1, the distance Lcc between the constriction portion 36-1 and the constriction portion 36-2 is made longer, it is possible to incline the press-fit portion 32 so as to be introduced easily into the through-hole 9$h$ during the earlier period of insertion.

Embodiment 4

Figure 13:
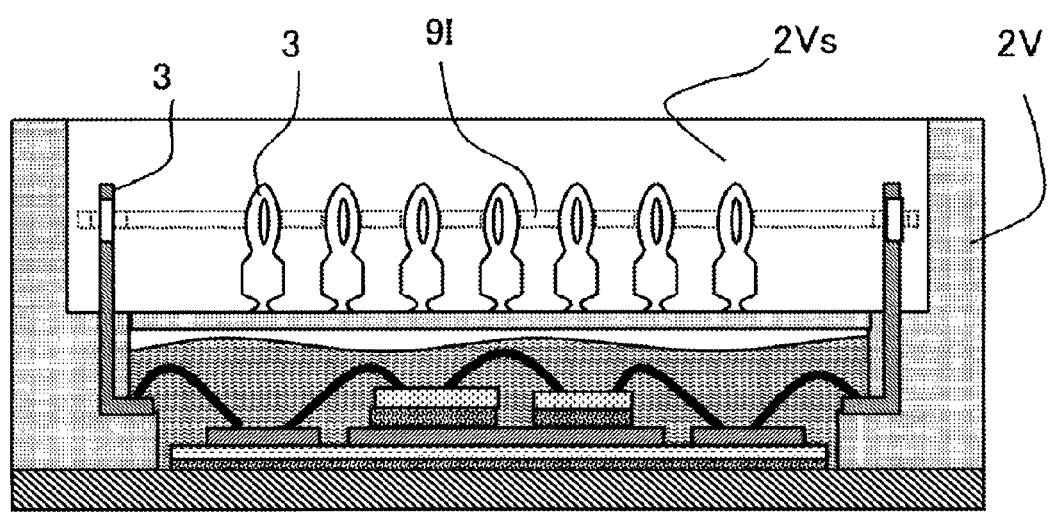
FIG. 13 is a sectional view for illustrating a power semiconductor device according to Embodiment 4 of the invention.

A power semiconductor device according to Embodiment 4 is provided with the press-fit terminal that is described in each of aforementioned Embodiments; however, a difference resides in its positional relationship to the package. FIG. 13 is for illustrating the power semiconductor device according to Embodiment 4 of the invention, and is a sectional view corresponding to FIG. 2 in Embodiment 2 as well as a diagram in which a region of a built-in internal printed circuit board is made transparent.

The power semiconductor device according to Embodiment 4 is a device that is generally called as an intelligent power module in which a drive circuit and a self-protection function circuit for the power device are mounted. In the intelligent power module, as shown in FIG. 13, a control board 9I on which the drive circuit and the like are mounted is accommodated inside a package 2V of a power semiconductor device 1V. Namely, the control board 9I is placed at a position deeper than that of the upper face of the package 2V.

Here, description will be made about a method of attaching the control board 9I to the press-fit terminals 3 exposed in an internal space 2Vs of the package 2V of the power semiconductor device 1V. Also in this case, as described in the attaching method of Embodiment 3, the respective press-fit terminals 3 are placed in a state where their heads are provisionally inserted in the through-holes 9h of the control board 9I. Then, pressing is applied to between the bottom face (the base plate-side) of the power semiconductor device 1V and the upper face of the control board 9I to thereby insert at once the respective press-fit terminals 3 into the through-holes 9h, so that insertion is completed.

At this time, since the exposed portions of the press-fit terminals 3 are placed in the internal space 2Vs of the power semiconductor device 1V, it is unable to insert the press-fit terminals 3 while grasping their pressing faces by a jig, for example, as in Patent Document 2. Thus, in the case of the press-fit terminal with a body portion having a part (bending part) with no material around its center axis, the bending part will cause a buckling deformation, resulting in non-inserted state of the press-fit terminal. Furthermore, when the residual wall is biased toward one side of the center axis, since the deformation direction is limited, it is only possible to deal with a positional deviation in one direction.

However, as mentioned above, since the constriction portion 36 is formed in the body portion 33 so as to leave the residual wall at both sides of the center axis in the insertion direction, there is no case where the body portion 33 causes buckling. For this reason, even in the case of performing attaching in the internal space 2Vs as in Embodiment 4, it is possible to insert the press-fit terminals 3 into the through-holes 9h without the need of supporting the respective body portions 33 thereof. Because the body portions 33 are not needed to be supported, it is possible not only to simplify the configuration of the jig to thereby reduce cost of the jig, but also to enhance the productivity. Namely, when the press-fit portions 32 are arranged inside the housing (internal space 2Vs), an effect by the press-fit terminal 3 that satisfies the aforementioned conditions is produced more significantly.

DESCRIPTION OF REFERENCE NUMERALS AND SIGNS 1, 1V: power semiconductor devices, 2, 2V: packages (housings), 2Vs: internal space, 3: press-fit terminal (terminal), 3V: pin terminal (terminal), 4: base plate, 5: circuit board, 6: power semiconductor element, 7: bonding wire, 8: solder, 9: printed circuit board (apparatus to be connected), 9h: through-hole (contact), 9I: control board (apparatus to be connected), 32: press-fit portion (outer terminal portion), 32V: soldering contact (outer terminal portion), 33: body portion, 33e: exposed portion, 33u: insert portion, 35: wire-bond portion (internal terminal portion), 36: constriction portion, 36-1: constriction portion in the side nearer to the press-fit portion, 36-2: constriction portion in the side farther from the press-fit portion, 201: lower jig, 202: upper jig, Lcc: distance between constriction portions, Lpc: distance between the center of the press-fit portion and the constriction portion in the side nearer thereto, Pp: center of the press-fit portion in the longitudinal direction, Wb: width of each of branched portion in the press-fit portion, Wc: width of the constriction portion, Wc1: width of the nearer-side constriction portion, Wc2: width of the farther-side constriction portion.

The invention claimed is:
1. A power semiconductor device which is to be electrically connected to an apparatus, comprising:
a circuit board which is disposed in a housing made of a resin, and on which a power semiconductor element is formed; and
a plurality of press-fit terminals which are each electrically connected, at one end, to the circuit board, and are each to be electrically connected, at the other end, to the apparatus,
said press-fit terminals being formed of a metal plate member, and each comprising:
an inner terminal portion electrically connected in the housing to the circuit board;
a body portion which has an embedded portion that is continuous to the inner terminal portion and embedded in the housing, and an exposed portion exposed from the housing; and
a press-fit portion which is supported by the body portion, has branched portions that are branched in a width direction of the body portion, and serves as an electrical contact with the apparatus;
wherein, in the exposed portion, there is formed a constriction portion that is concaved from both sides of the body portion in the width direction that is perpendicular to a center line that connects the press-fit portion and a root portion in the exposed portion, so as to leave a portion around the center line; and
wherein a width of the embedded portion is wider than a width of the constriction portion.
2. The power semiconductor device of claim 1, wherein the press-fit portion has a doubly supported beam structure in which the respective branched portions face each other with a gap therebetween.
3. The power semiconductor device of claim 1, wherein the constriction portion has concaved tips each having a curved shape.
4. The power semiconductor device of claim 1, wherein, in the press-fit portion, each of edges at four corners of the branched portions has a curved shape in cross-section.
5. The power semiconductor device of claim 4, wherein the width of the constriction portion is narrower than a width of each of the branched portions in the press-fit portion.
6. The power semiconductor device of claim 1, wherein, in the body portion, the width of the constriction portion is narrowest among widths of the exposed portion.
7. The power semiconductor device of claim 1, wherein, in the exposed portion, a height of a region in which the constriction portion is formed, is less than a sum of heights of regions in which no constriction portion is formed.
8. The power semiconductor device of claim 1, wherein the embedded portion and the inner terminal portion are bent to each other at a bending portion and a portion around the bending portion is embedded in the housing.
9. The power semiconductor device of claim 1, wherein the housing and the press-fit terminals are molded together by injection molding.
10. The power semiconductor device of claim 1, wherein the respective press-fit portions of the plurality of press-fit terminals are arranged in the housing.
11. The power semiconductor device of claim 1, wherein the power semiconductor element is formed of a wide bandgap semiconductor material.
12. The power semiconductor device of claim 11, wherein the wide bandgap semiconductor material is silicon carbide, a gallium nitride family material or diamond.

13. A power-semiconductor-device incorporating apparatus, comprising:
   the power semiconductor device of claim 1; and
   an apparatus which is provided with a plurality of through-holes at positions corresponding to the plurality of press-fit terminals;
   wherein the apparatus is electrically connected to the power semiconductor device through the through-holes by use of mechanical contact force produced between the press-fit portion and each of the through holes, due to a spring property of the press-fit portion.

* * * * *